United States Patent [19]
Hansen

[11] 3,995,220
[45] Nov. 30, 1976

[54] INTERFERENCE PULSE SUPPRESSION CIRCUIT FOR RADIO RECEIVERS

[75] Inventor: Jens Hansen, Hildesheim, Germany

[73] Assignee: Blaupunkt-Werke GmbH, Hildesheim, Germany

[22] Filed: Aug. 14, 1975

[21] Appl. No.: 604,491

[30] Foreign Application Priority Data
May 21, 1975 Germany............................ 2522382

[52] U.S. Cl.................................. 325/478; 325/480
[51] Int. Cl.² ............................................. H04B 1/10
[58] Field of Search ............ 325/322, 473, 478, 479, 325/480; 328/165

[56] References Cited
UNITED STATES PATENTS

| | | | |
|---|---|---|---|
| 3,304,503 | 2/1967 | Walker, Jr. et al................. | 325/478 |
| 3,889,192 | 6/1975 | Schiebelhuth et al. ......... | 325/478 X |

*Primary Examiner*—Benedict V. Safourek
*Attorney, Agent, or Firm*—William R. Woodward

[57] ABSTRACT

Radio frequency disturbance recognition circuits having their inputs tuned to different frequency bands by resonant circuits are coupled to the antenna input of a receiver to be protected through a decoupling stage that prevents excessive coupling and AND-gates are provided so that an interference blanking circuit will be operated to produce a momentary interruption of the low-frequency signal path only when a disturbance is detected by the radio frequency recognition circuits in both of their respective operating frequency ranges and at the same time a pulse disturbance is detected in the output of the receiver demodulator by a disturbance voltage detector circuit tuned to a frequency band higher than the frequency band of the low-frequency signal to be protected.

4 Claims, 1 Drawing Figure

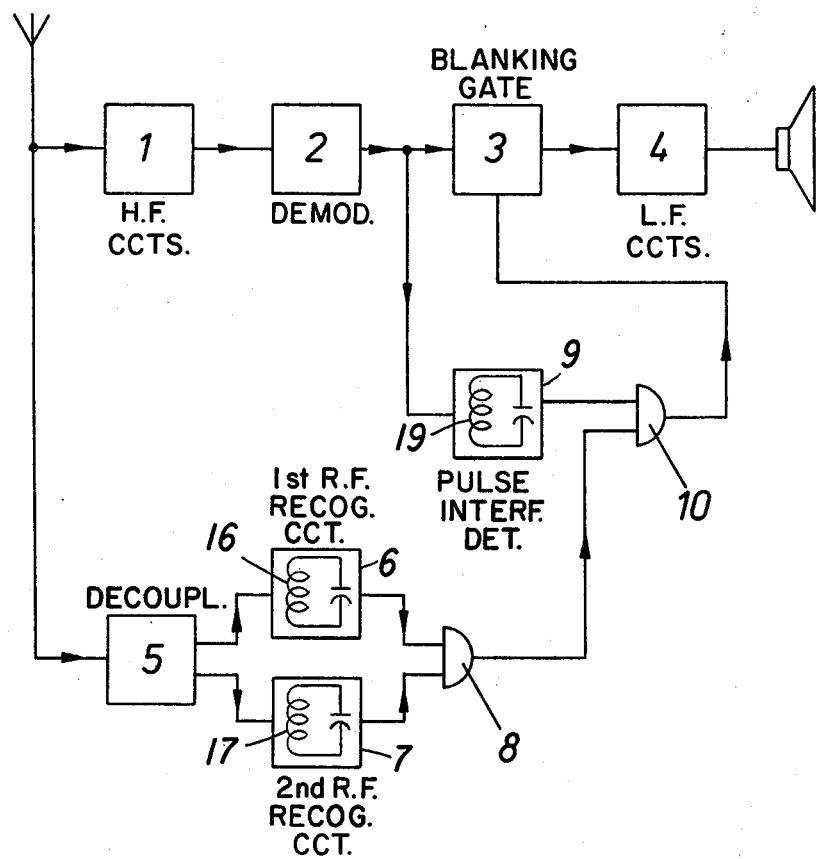

INTERFERENCE PULSE SUPPRESSION CIRCUIT FOR RADIO RECEIVERS

This invention relates to a circuit for suppression of interference in a radio receiver in which an electrically controlled gate circuit is interposed in the low-frequency signal path following the demodulator of the receiver and in which a disturbance signal detector is provided which is arranged to respond to a disturbance pulse by producing a control pulse to block the gate circuit and interrupt the low-frequency signal momentarily. Such circuits are used to prevent interference pulses received over the antenna and appearing in the demodulator output from reaching the low-frequency amplifier of the receiver.

It is known to pick up disturbance pulses from the output of the FM demodulator of an FM receiver to operate a disturbance voltage detector therewith which will respond by momentarily blocking a gate circuit interposed in the low-frequency signal path following the demodulator. During this interruption, known as the blanking interval, only the voltage value of the low-frequency signal that was present shortly before the disturbance in a storage capacitor on the output side of the gate circuit is supplied to the low-frequency amplifier. In order to suppress the leading edge of the disturbing pulse as well as the rest of it, the low-frequency signal from the demodulator is furnished to the gate circuit over a delay line.

For the suppression of disturbances in AM reception, circuits in which the disturbance signal is obtained only from the demodulator are unsuitable. Because of the narrow band nature of the AM receiving components, it is not possible to obtain disturbance pulses with steep leading and trailing edges on the output side of the demodulator. The disturbance pulses must therefore be obtained for control purposes from the high-frequency part of the receiver. If the disturbing pulses are obtained only at the antenna input of the receiver, blanking occurs even when there is no disturbance pulse in the demodulator output. Such blanking operations can disadvantageously impair the signal reproduction quality of the receiver.

It is an object of the invention to provide a pulse interference suppression circuit that is effective both for AM and FM reception and which does not have the disadvantages above mentioned.

SUBJECT MATTER OF THE PRESENT INVENTION

Briefly, separate first and second pulse recognition circuits responsive in different frequency bands are connected to the antenna input of the receiver and the outputs of these recognition circuits and also the output of a disturbance signal detector responsive to the demodulator output are so combined by means of AND-gates and connected to the control input of the blanking switch of the receiver, that the blanking gate receives a blocking pulse only when both radio frequency pulse recognition circuits and the disturbance voltage detector respond simultaneously to a disturbance pulse. This is preferably obtained by utilizing a first AND-gate responsive to the two radio frequency pulse recognition circuits and a second AND-gate responsive to the output of the first AND-gate and to the output of the disturbance signal detector.

The advantages obtained by the invention consist particularly in that false operation of the blanking switch are prevented from being caused by the presence of high frequencies along with the low-frequency signal in the demodulator output in the absence of pulse disturbances and/or by the presence of high-frequency transient oscillations in the antenna circuit that do not give rise to pulse disturbances in the demodulator output.

The invention is further described by way of an illustrative example with reference to the accompanying drawing, of which the single FIGURE is a block diagram of a radio receiver embodying the invention.

As shown in the drawing, a radio broadcast receiver equipped with an interference suppression circuit has the conventional arrangement of a high-frequency reception portion 1, a signal demodulator 2, a blanking circuit 3 interposed in the low-frequency signal path and a low-frequency amplifier 4. In this case, the antenna-fed input of the receiver is connected over a decoupling stage 5 with a first recognition circuit 6 and with a second recognition circuit 7. Radio frequency resonant circuits respectively tuned to different resonant frequencies symbolically shown at 16 and 17 are provided in the respective inputs of the recognition circuits 6 and 7. Consequently, the response of the respective pulse recognition circuits 6 and 7 is caused to be substantially limited respectively to first and second frequency bands. The outputs of the recognition circuits 6 and 7 are respectively connected to the inputs of a first AND-gate 8. The low-frequency signal available at the output of the signal demodulator is supplied to a disturbance signal detector 9 for recognition of a disturbing pulse. For improved recognition of disturbance pulses, the input of the disturbance signal detector 9 can be provided with a resonant circuit 19 of which the resonant frequency is above the frequency band utilized by the low-frequency signal to be protected from interference and this resonant frequency is of course chosen to be as close as is practical to the frequency band of the protected signal without risk of response to strong components of the protected signal. The output of the disturbance signal detector 9 and that of the first AND-gate 8 are respectively supplied to the inputs of a second AND-gate 10, of which the output is connected to the control input of the blanking gate circuit 3 interposed in the low-frequency path of the receiver. If disturbing signals are supplied to the receiver from the antenna, they are brought to the recognition circuits 6 and 7 through the decoupling stage 5. Since disturbing signals, particularly interfering pulses, spread over a broad frequency spectrum, the differently tuned resonant circuits of the recognition circuits 6 and 7 are both excited by a disturbing pulse. Both radio frequency recognition circuits then respond to a disturbance pulse by providing a control pulse to an input of the AND-gate 8, so that when they both respond at once, the first AND-gate 8 provides a control pulse to one input of the second AND-gate 10. The other input of the second AND-gate 10 is connected to the output of the disturbance signal detector 9, so that if the latter responds simultaneously with the response of both radio frequency recognition circuits to a disturbance pulse, a control pulse will be provided by the output of the second AND-gate 10 to the control input of the blanking gate circuit to interrupt momentarily the low-frequency signal path. Duration of the interruption is determined by a monostable multivibrator not shown in the drawing. If disturbance pulses appear only at the antenna input of the receiver but not in the output of the signal demodulator, there is no blanking of the low-frequency signal. In consequence, the impairment of the reproduction quality by false blanking is mitigated. False blanking by high frequencies contained in the low-frequency signal output of the demodulator is likewise prevented when no disturbance pulses are present at the antenna input. The provision of different frequency ranges of response for the respective recognition circuits 6 and 7, prevents the provision of blanking in response to signal-frequency oscillations in the radio frequency range.

The decoupling stage 5 prevents the recognition circuits from excessively loading the antenna circuit and can conveniently be an impedance converter, for example an emitter follower circuit, or more preferably, the corresponding field effect transistor (FET) circuit.

I claim:

1. A pulse interference suppression circuit for a radio receiver having an input connected to an antenna element, comprising in combination:
    a demodulator circuit;
    electrically controllable blanking switch means for interrupting the output of said demodulator circuit;
    disturbance pulse detection means (9) having as input an output signal of said demodulator circuit taken from a circuit location ahead of said blanking switch means;
    first and second radio frequency disturbance recognition circuits (6,7) tuned respectively to different radio frequency bands and both connected so as to receive an input signal derived from a signal at the input of said radio receiver;
    first AND-gate means (8) responsive to the respective outputs of said first and second radio frequency disturbance recognition circuits (6,7) for producing an output signal when a disturbance is recognized simultaneously by both of said radio frequency disturbance recognition circuits;
    second AND-gate means (10) responsive to the output of said first AND-gate means and to the output of said disturbance pulse detector circuit for electrically operating said blanking gate to interrupt the output of said demodulator circuit, when both of said radio frequency disturbance recognition circuits (6,7) and said disturbance pulse detection means (9) simultaneously respond to a disturbance pulse.

2. A circuit as defined in claim 1, in which said first and second radio frequency disturbance recognition circuits (6,7) are connected with the input of said receiver through a decoupling stage (5).

3. A circuit as defined in claim 1, in which said first and second radio frequency disturbance recognition circuits respectively include resonant circuits resonant at respectively different frequencies.

4. A circuit as defined in claim 1, in which said disturbance pulse detection means (9) is provided at its inputs with a resonant circuit of which the resonant frequency is above the upper end of the frequency band of the usable output signal supplied by said demodulator circuit through said blanking switch to following stages of the radio receiver.

* * * * *